United States Patent [19]

Cachier

[11] Patent Number: 4,876,239

[45] Date of Patent: Oct. 24, 1989

[54] MICROWAVE SWITCH HAVING MAGNETICALLY BIASED SUPERCONDUCTIVE CONDUCTORS

[75] Inventor: Gérard Cachier, Bures sur Yvette, France

[73] Assignee: Thomson-CSF, Puteaux, France

[21] Appl. No.: 322,578

[22] Filed: Mar. 13, 1989

[30] Foreign Application Priority Data

Mar. 18, 1988 [FR] France ............................. 88 03525

[51] Int. Cl.$^4$ ............................................. H01P 1/10
[52] U.S. Cl. ........................................ 505/1; 333/246; 333/258; 333/262; 333/99 S; 505/866
[58] Field of Search .............. 333/101, 258, 262, 99 S, 333/246; 307/245; 505/1, 860, 866

[56] References Cited

U.S. PATENT DOCUMENTS

| | | | |
|---|---|---|---|
| 3,522,492 | 8/1970 | Pierce | 357/5 |
| 3,769,618 | 10/1973 | Freedman | 333/238 |
| 4,695,811 | 9/1987 | Grellmann et al. | 333/262 X |
| 4,754,384 | 6/1988 | Levy et al. | 307/245 X |

FOREIGN PATENT DOCUMENTS 47686 3/1982 European Pat. Off. .
1591528 4/1970 Fed. Rep. of Germany .

OTHER PUBLICATIONS

D. M. Kitching. P.I.E.E. (GB) vol. 115, No. 4, Apr. 1968-pp. 479–486, "Narrowband Microwave Suppression Filters".

Primary Examiner—Paul Gensler
Attorney, Agent, or Firm—Roland Plottel

[57] ABSTRACT

A microwave switch comprises a transmission line section which separates into two arms, at least one of which can go from a normal state to a superconductive state at a critical temperature, a junction rejoining the two arms in a second microwave transmission line section, and means to control the normal or superconductive state of one arm or of the two arms. The difference in length between the two arms is chosen to be substantially equal to an odd of half wavelengths of operation of the switch in such a way that the switch is off or on when the two arms are respectively in the same state, namely normal or superconductive, or in a different state. The state of the arms can be controlled by a magnetic field which causes the critical temperature to vary.

8 Claims, 1 Drawing Sheet

FIG_1
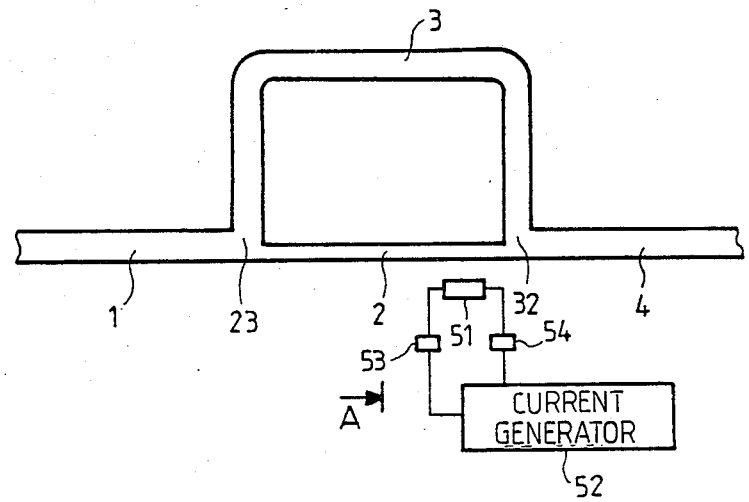
FIG_2
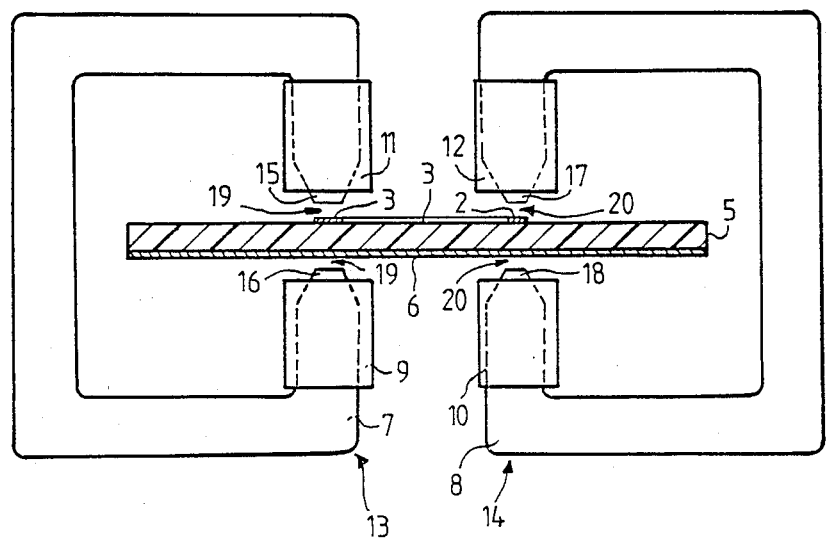

MICROWAVE SWITCH HAVING MAGNETICALLY BIASED SUPERCONDUCTIVE CONDUCTORS

BACKGROUND OF THE INVENTION

1. Field of the Invention

An object of the invention is a microwave switch, comprising an interference device, either arm of which is capable of undergoing a reversible transition from a normal state to a superconductive state, with the position of the switch depending on the respective state (normal or superconductive) of the two arms. A switch of this type can be advantageously applied to the making of duplexers for radar systems, microwave phase-shifters and microwave attenuators.

The characteristics of a microwave switch are notably:

its frequency (or its wavelength) of operation;

the width of the passband in which the operating frequency is located;

the nature and extent of the losses due to its presence along a microwave line, said presence being capable of introducing a partial reflection (measured by an SWR), losses by radiation and/or thermal losses, and a partial deflection of the energy transmitted along the line;

its switching-over time between an "on" state (corresponding to a closing of the switch) and an "off" state (corresponding to an opening of the switch), and reciprocally;

its power-handling capacity;

its dimensions, dependability, consumption and cost of manufacture.

2. Description of the Prior Art

There are known methods of using a PIN diode (adapted, as is known, to microwave signals) as a microwave switch: when subjected to a forward bias, it behaves like an "on" switch, and when a reverse bias is applied to it, it is similar to an "off" switch. However, as is known, the switching-over time of a diode of this type is limited, at the lower end, by the time needed to discharge the minority carriers (which are the carriers that most extensively contribute to the passage of a microwave current when the diode is forward biased). Furthermore, a PIN diode mounted on a microwave line introduces a spurious resistance in series (this is a phenomenon known to those skilled in the art). Finally, the power-handling capacity of a diode of this type is limited, at the upper end, by the value of the avalanche voltage of the diode.

There is also a known way to use a so-called TR tube as a microwave swich: (TR being an abbreviation of the term "transmit-receive": this type of tube indeed is often used in a radar antenna to insulate the receiver at transmission and prevent the propagation of signals towards the transmitter at reception). The switching-over time of tubes of this type is unfortunately limited, at the lower end, by the time needed for the discharge and/or elimination of ionized atoms and electrons. Furthermore, this relaxation phenomenon, as it is known, is only partial: the residual ionization of the gas contained in the tube damages the dependability of said switch.

SUMMARY OF THE INVENTION

The invention concerns a microwave switch comprising a microwave line section which separates into two arms of different lengths. These two arms then join up again in a second section. The difference in length between the two arms is substantially equal to an odd number of half wavelengths of operation of the switch. At least one of the two arms is capable of going, reversibly and under control, from a normal state to a superconductive state. The switch is open (namely in the "off" state) when both arms are in the same state, and closed (namely in the "on" state) if this is not the case.

More precisely, an object of the invention is a microwave switch comprising:

a first microwave line section;

a bifurcation of the first section into a first microwave line arm and a second microwave line arm, a rejoining of the two arms in a second microwave line section;

phase-shifting means to place the signals, transmitted in each of the two arms and recombined at said rejoining point, in phase opposition; said phase-shifting means consisting of the first arm and of the second arm the respective lengths of these two arms differing by a quantity which is substantially equal to an odd number of half wavelengths of operation of the switch, at least one of the two arms being capable of going reversibly from a normal state to a superconductive state at a critical temperature, the impedances of these arms providing for a division of the power into two substantially equal parts at the position of the bifurcation when both arm are in the same state, control means to control the phase-shifting means; said control means governing the state of at least one of the two arms, an identity and a difference of state between the two arms providing respectively for the opening and closing of the switch.

BRIEF DESCRIPTION OF THE DRAWINGS

Precise details, particular features and embodiments of the invention will appear in the following description, made with reference to the appended figures, of which:

FIG. 1 shows a partial top view of a microwave switch according to one embodiment of the invention;

FIG. 2 shows a schematic sectional view of the microwave switch of FIG. 1.

In these two figures, firstly, the real scale and proportions of the different elements have not been kept, and secondly, the same references are repeated for the same elements.

DESCRIPTION OF PREFERRED EMBODIMENTS

FIG. 1 shows a partial top view of a switch according to one embodiment of the invention, made with microstrip lines 1, 2, 3, and 4, having a common dielectric substrate (not shown in FIG. 1) and a common ground plane (not shown in FIG. 1).

A first microstrip line 1 (hereinafter called section 1) is divided into two microstrip lines 2 and 3 (hereinafter called arms 2 and 3) at a bifurcation 23. The two arms 2 and 3 join up again at a rejoining point 32 to again form a single microstrip line 4 (hereinafter called section 4). The length of the arm 3 is greater than that of the arm 2, and the difference in length between these two arms is substantially equal to an odd number of half-wavelengths of operation of the switch.

The respective central conductors of the sections 1 and 4 and the arms 2 and 3 are made of one and the same superconductive material with a critical temperature $T_c$ (namely, the reversible transition temperature between a "normal" state and a "superconducting" state of said material) that is preferably greater than 30 K. For example, there are known superconductive materials for which the critical temperature $T_c$ is comprised between 30 K and 95 K: these materials are, for example, copper oxides. The working of the switch (explained hereinafter) brings into play the superconductivity of only one or of both arms 2 or 3, but the central conductors of the sectons 1 and 4 or arms 2 and 3 are advantageously made of the same material in order to prevent the occurrence of losses, notably by reflection at the junctions between different materials, and in order to simplify the industrial-scale manufacture of the switch according to the present invention.

The common ground plane (not shown in FIG. 1) is preferably made of the same material as the central conductors: this is for greater convenience during the manufacture of the presently described switch. The choice of the constituent material of the common ground plane is, in any case, within the scope of those skilled in the art concerning both microwave lines and superconductivity.

The presently described switch is further provided with control means for the control of the state (normal or superconductive) of the material forming the central conductor of the arm 2 and/or (depending on the desired mode of operation, the different modes of operation of the switch being described hereinafter) the central conductor of the arm 3. When the state of each of the two arms 2 and 3 can be controlled, the means for controlling the state of each of these two arms are independent. Should the common ground plane be also made of a superconductive material, the same control means control the state (normal or superconductive) of that portion of the ground plane which is located so that it substantially faces the central conductor of the arm 2 and/or (as explained above) the central conductor of the arm 3.

According to a first mode of operation of the presently described switch, the switch is open (i.e. placed in the "off" state) by making both the arm 2 and the arm 3 superconductive (namely by placing the respective central conductors of the arms 2 and 3 and, if necessary, the portions of the common ground plane facing these arms, in a superconductive state): for, a microwave signal propagated along the section 1 towards the bifurcation 23 gives rise to two signals that are respectively propagated along the arms 2 and 3, which meet again at the rejoining point 32 in phase opposition. Provided that there is adequate matching of the respective impedances of the arms 2 and 3 (a matching of this type can be easily achieved by those skilled in the art: it is particularly aimed at obtaining a division of the power into two substantially equal parts at the bifurcation (23); it is shown schematically in FIG. 1 by the fact that the central conductor of the line 2 is narrower than that of the line (3), said two signals are recovered at the rejoining point 32 with, in addition, substantially equal amplitudes. The relative phases and amplitudes of the these two signals prevent any propagation of a signal along the section 4, in moving away from the rejoining point 32. The switch is indeed open. To close the switch (namely, to put it in an "on" state), one of the arms 2 or 3, for example the arm 2, is made to go into a normal state (by manipulating the control means mentioned above and described below). The (superconductive) arm 3 then shortcircuits the (normal) arm 2. More precisely, a microwave signal, which is propagated along the section 1 towards the bifurcation 23, passes substantially integrally into the arm 3, and is propagated along this arm 3, goes through the rejoining point 32 and then gets propagated along the section 4, in moving away from this rejoining point 32. The switch is indeed closed.

According to a second mode of operation of the presently described switch, the switch is open when the arms 2 and 3 are both normal. The switch then behaves substantially in the same way as when the arms 2 and 3 are each superconductive (this corresponds to the first mode of operation described above) through a greater effort of matching the respective impedances of the arms 2 and 3, because of higher losses along the arms 2 and 3. To close the switch, one of the arms 2 or 3, for example, the arm 3, is put into a superconductive state. This arm 3 then shortcircuits the arm 2.

FIG. 2, which is a schematic sectional view, along the line AA of FIG. 1, of the microwave switch of this FIG. 1, illustrates an embodiment of the means for controlling the state (normal or superconductive) of the arm 2 and/or the arm 3. These means comprise two electromagnets 13 and 14, which are independent (i.e. supplied independently of one another). As is known, the electromagnets 13 and 14 respectively have a soft iron rod, 7 and 8 respectively, curved so as to form an open loop, the ends 15, 16 and 17, 18 respectively of which are surrounded by coils 11, 9 and 12, 10 respectively and are located around the arms 3 and 2 respectively. In other words, the arms 3 and 2, respectively, are in the air gaps 19 and 20, respectively, of the electromagnet 13 and 14 respectively.

This FIG. 2 further shows the common ground plane 6 and the common dielectric substrate 5 mentioned in the description of FIG. 1.

The electromagnets 13 and 14 are used to apply a substantially uniform magnetic field in the arms 3 and 2 respectively, this substantially uniform magnetic field being capable of varying in time (i.e. it is not constant). The variation of this magnetic field produces a variation of the critical temperature $T_c$ of each of the arms 3 and 2. It is thus possible to bring the critical temperature $T_c$ of a given arm down to below the temperature T at which the switch works (this may be, for example, the temperature of liquid nitrogen) and thus make the arm "normal". Conversely, the critical temperature $T_c$ of a given arm can be raised above the temperature T of the switch, and the arm can thus be made "superconductive".

Instead of making $T_c$ vary around T, as has been explained in the above paragraph, it is also possible to make T vary around $T_c$ (which is simpler from a conceptual view point but more complicated to achieve in practice, as is known by those skilled in the art). This way of controlling the state (normal or superconductive) of either of the arms, comes within the scope of the invention.

A variation, such as this, in the temperature T may be obtained, for example, by means of a resistor 51 fabricated as a thin layer on the dielectric substrate common to the lines 1, 2, 3, 4 in the vicinity of one of the arms 2 or 3, as shown in FIG. 1. This resistor 51 is connected to a current generator 52, for example by means of connection zones 53 and 54. When no current flows through the resistor 51, the two arms are at the same temperature which is chosen to be below the critical temperature $T_c$ of the arms. These arms are then both superconductive and the switch is open. When a current flows through this resistor 51, at least one part of one of the arms such as, for example, the arm 2, is heated to a temperature higher than $T_c$, thus making all the signals go through the arm 3: the switch is then closed.

The invention also concerns a switch similar to the one described above, but one made of waveguides, coaxial lines or any other type of microwave line with distributed constants or localized constants (and no longer with microstrip lines). Waveguides comprising inner walls coated with a superconducting material are known. Depending on the state (normal or superconductive) of the material coatng said walls, the guides are also "normal" or "superconductive" with respect to the propagation of a microwave signal. A switch of this type comprises, for example:

a first waveguide (forming said section 1);

a first parallel T junction (forming said bifurcation 23);

two portions of waveguides (respectively forming said arms 2 and 3);

a second parallel T junction (forming said rejoining point 32);

a second waveguide (forming said setion 4).

Naturally, the invention is not restricted to the embodiments described. In particular, it covers the use of any type of junction which may or may not introduce additional phase shifts.

What is claimed is:

1. A microwave switch comprising:
   a first microwave line section;
   a bifurcaton of the first section into a first microwave line arm and a second microwave line arm,
   a rejoining of the two arms in a second microwave line section;
   phase-shifting means to place the signals, transmitted in each of the two arms and recombined at said rejoining point, in phase opposition; said phase-shifting means consisting of the first arm and of the second arm, the respective lengths of these two arms differing by a quantity which is substantially equal to an odd number of half wavelengths of operation of the switch, at least one of the two arms being capable of going reversibly from a normal state to a superconductive state at a critical temperature the impedances of these arms providing for a division of the power into two substanially equal parts at the position of the bifurcaiion when both arms are in the same state,
   control means to control the phase-shifting means; said conirol means governing the state of at least one of the two arms, an identity and a difference of state between the two arms providing respectivey for the opening and closing of the switch.

2. A microwave switch according to claim 1, wherein said control means provide for an application of a variable magnetic field to at least of one of the two arms, said application causing the critical temperature of at least one of the arms to vary, thus providing for a reversible change, from a normal state to a superconductive state, of at least one of the arms without any variation in its temperature.

3. A microwave switch according to claim 2, wherein said control means comprise two independent electromagnets, the respective air gaps of which are located respectively around said two arms.

4. A microwave switch according to claim 1, wherein said control means provide for a variation in the temperature of at least one of said two arms, around the critical temperature without variation in this temperature.

5. A microwave switch according to claim 1, which is open when said two arms are in a normal state.

6. A microwave switch according to claim 1, which is open when said two arms are in a superconductive state.

7. A microwave switch according to claim 1, wherein said sections and arms of microwave lines are microstrip lines.

8. A microwave switch according to claim 1, wherein:
   said sections and arms of microwave lines are waveguides;
   said bifurcation and said rejoining point are parallel T junctions.

* * * * *